United States Patent
Zirkle

(10) Patent No.: US 7,386,581 B2
(45) Date of Patent: Jun. 10, 2008

(54) PERFORMANCE FIR FILTER

(75) Inventor: Carson H. Zirkle, Manchester, PA (US)

(73) Assignee: STMicroelectronics, Inc., Carrollton, TX (US)

( * ) Notice: Subject to any disclaimer, the term of this patent is extended or adjusted under 35 U.S.C. 154(b) by 872 days.

(21) Appl. No.: 10/750,019

(22) Filed: Dec. 31, 2003

(65) Prior Publication Data

US 2005/0141604 A1    Jun. 30, 2005

(51) Int. Cl.
*G06F 17/10*    (2006.01)

(52) U.S. Cl. ..................................... 708/319

(58) Field of Classification Search ................. 708/319
See application file for complete search history.

(56) References Cited

U.S. PATENT DOCUMENTS

| | | | |
|---|---|---|---|
| 5,117,385 A * | 5/1992 | Gee | ........................... 708/625 |
| 5,566,101 A | 10/1996 | Kodra | |
| 5,633,893 A * | 5/1997 | Lampe et al. | ................ 375/297 |
| 6,487,190 B1 | 11/2002 | Regis | |
| 6,546,408 B2 * | 4/2003 | Page et al. | ................... 708/319 |
| 6,907,024 B2 * | 6/2005 | Regis | ........................ 370/342 |
| 2002/0107898 A1 | 8/2002 | Reefman et al. | |

OTHER PUBLICATIONS

J.J. van der Kam, "A ditital decimating filter for analog-to-digital conversion of hi-fi audio signals," Philips Technisch Tijdschrift, Natuurkundig Laboratorium der N.V. Philips, Eindhoven, NL, vol. 42, No. 6/7, Apr. 1986, pp. 230-238, XP002187797, p. 6, col. 2; figures 8b, 8c.

European Search Report, EP 04 25 7907, dated Apr. 12, 2005.

* cited by examiner

*Primary Examiner*—D. H. Malzahn
(74) *Attorney, Agent, or Firm*—Lisa K. Jorgenson; Andre M. Szuwalski

(57) ABSTRACT

A single bit FIR filter that minimizes computation time by pre-storing outputs or portions of outputs for accumulation and output.

10 Claims, 2 Drawing Sheets

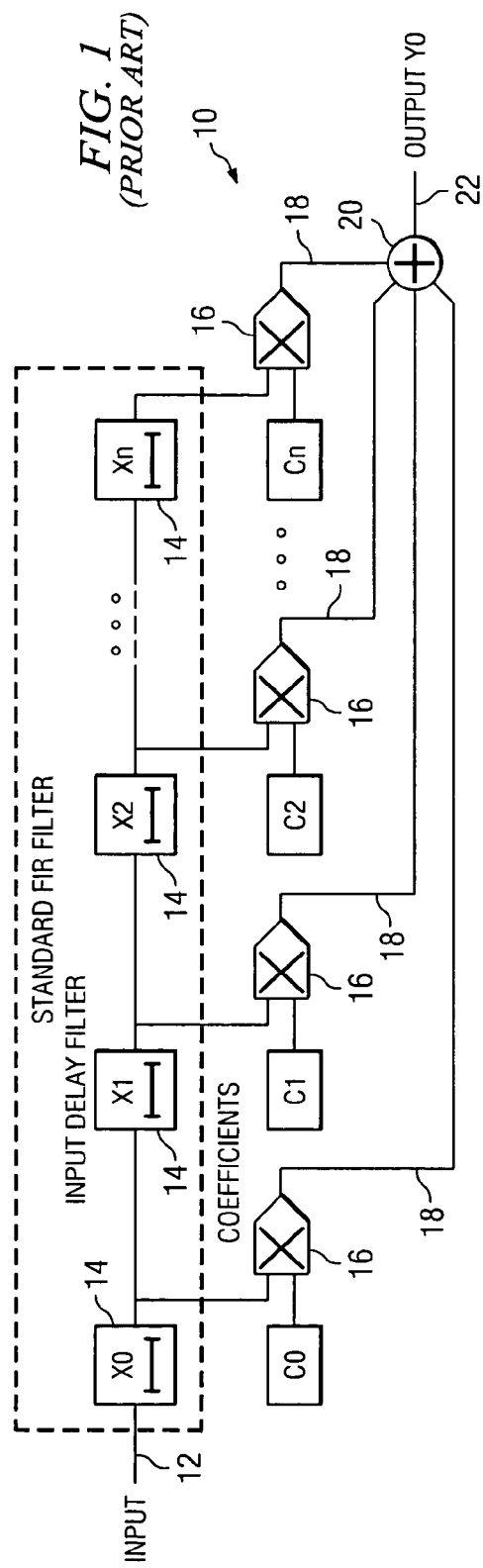
*FIG. 1 (PRIOR ART)*
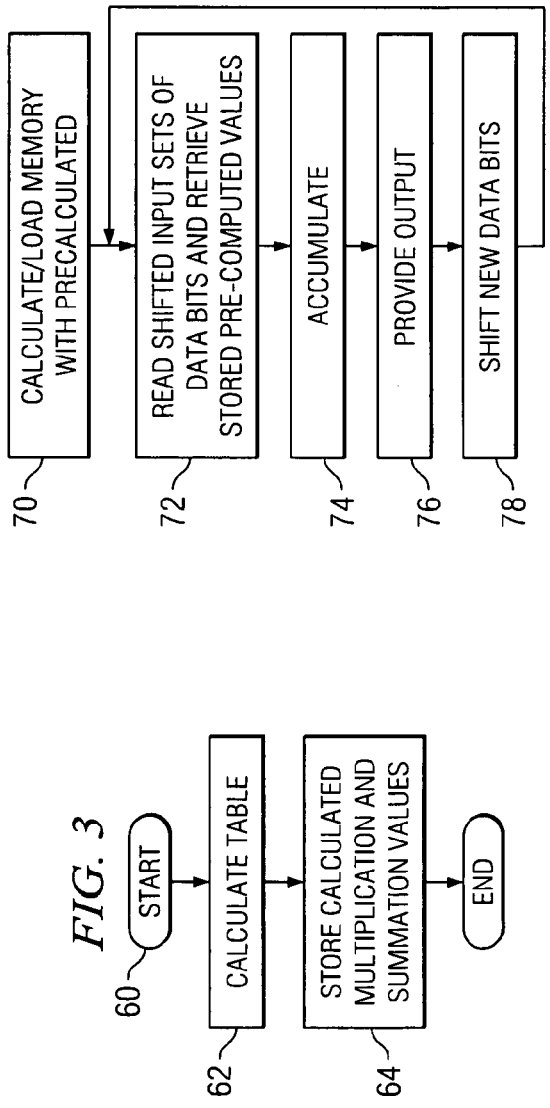
*FIG. 4*
*FIG. 3*

PERFORMANCE FIR FILTER

BACKGROUND OF THE INVENTION

1. Technical Field of the Invention

The present invention relates to FIR filters and in particular FIR filters with look-up tables.

2. Description of the Related Art

A classical Finite Impulse Response (FIR) filter multiplies input data by a coefficient. The FIR filter then accumulates the multiplied results together to produce an output. Generally, FIR filters are used to perform filtering function for digital signals. Such functions include digital signal highpass, lowpass, bandpass and notch filtering. The most likely uses for FIR filters are in digital audio processing. Digital audio processing is used in a variety of well known devices including radio; compact disk (CD) players for music and video; digital telephones including cellular, wireless and hard wired; digital video recording and playing equipment including computer, video disc players, video camera recorders, and cameras.

A FIR filter generally operates in the time domain by multiplying FIR coefficients with bits from the digital audio signal. The results of the multiplications are added or accumulated thereby producing the desired digitally filtered audio output.

In the recent past, single bit FIR filters have become more popular. Single bit FIR filters are being used a great deal in audio digital signal processing equipment because the use of a single bit data stream is being used with CD's and music streaming (to name a few). Another specific area that single bit data stream FIR filtering is being used in are direct stream transfer-direct stream digital (DST-DSD) decoding of super audio compact disc (SACD) material.

SUMMARY OF THE INVENTION

Embodiments of an exemplary FIR filter can perform or operate at the same level or higher than prior FIR FILTERS. Also, exemplary FIR filters may be less costly to manufacture than prior single bit FIR filters.

In many cases, an exemplary FIR filter exceeds prior FIR filters in performance using substantially the same generation of technology. These improvements are generally achieved by using a portion of the input data stream to the FIR filter as a memory address. The memory address location may store the multiplication and accumulation results for the portion of input data. The multiplication and accumulation results are accumulated, if necessary, with the multiplication and accumulation results of other portions of input data. Thus, the real time, physical multiplication of input data bits by coefficients do not need to be performed for each input bit by an exemplary FIR filter because of a look-up table of answers for portions of input data. In some exemplary FIR filters only addition functions will have to be performed to produce a FIR filter output.

BRIEF DESCRIPTION OF THE DRAWINGS

A more complete understanding of the system and method of the present invention may be obtained by reference to the following Detailed Description when taken in conjunction with the accompanying Drawings wherein:

FIG. 1 is a block diagram of a standard single bit FIR filter;

FIG. 3 is a flow chart of an exemplary technique for loading the memory of an exemplary FIR filter; and FIG. 4 is an exemplary flow diagram of an exemplary FIR filter.

DETAILED DESCRIPTION OF THE EXEMPLARY EMBODIMENTS

Figure 2:
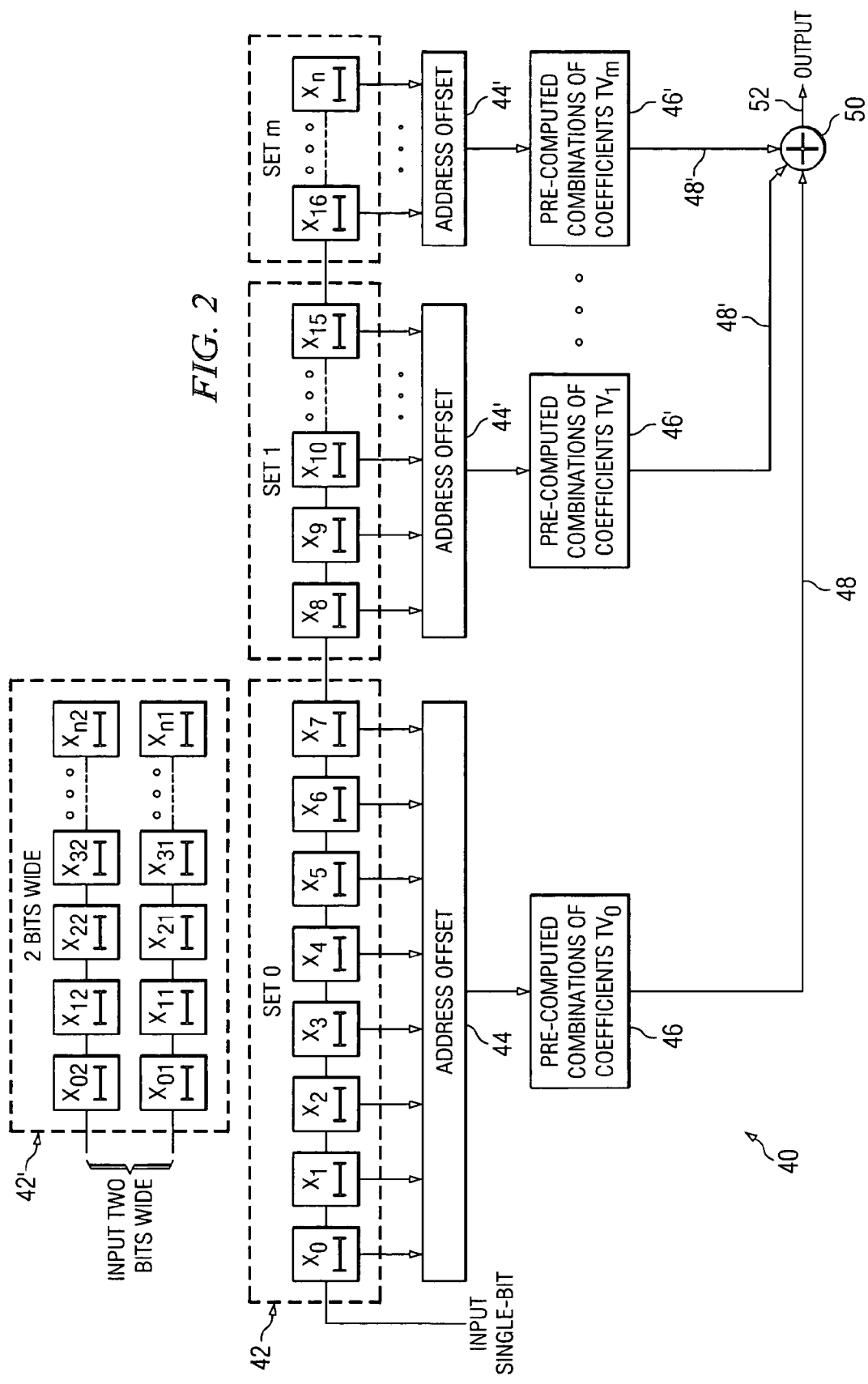
FIG. 2 is an exemplary block diagram of a single or multiple bit FIR filter in accordance with the present invention.

Exemplary embodiments of the present invention will now be described more fully hereinafter with reference to the accompanying drawings in which exemplary embodiments of the invention are shown. The invention, however, may be embodied in many different forms and should not be construed as being limited to the embodiments set forth herein. Rather, the embodiments are provided so that this disclosure will be thorough and complete, and will fully convey the scope of the invention to those skilled in the art.

Referring to FIG. 1, a standard FIR filter 10 is depicted in block diagram form. The standard FIR filter 10 is a single bit FIR filter. A single bit FIR filter is a FIR filter wherein the data input into the FIR filter 10 is a serial stream of data that is one bit wide. The digital data enters the input 12 of the standard FIR filter 10 and enters a delay line, serial latch shift resistor or derivation thereof 14. The bits of data are shifted or travel down the delay line 14 such that each bit is provided as $\chi_0, \chi_1, \chi_2 \ldots \chi_n$. Each bit $(\chi_0, \chi_1, \chi_2, \ldots \chi_n)$ is multiplied via the multiplier 16 with an associated coefficient $(C_0, C_1, C_2, \ldots C_n)$, which may be stored in a memory, in a table, in a latch or in another electronic storage means such as a flash memory, disk memory, RAM, ROM or derivations thereof. The output 18 of each multiplier 16 is then accumulated or added in the adder 20 in order to produce an output 22 of the standard single bit FIR filter 10. The coefficients $C_0, C_1, C_2, \ldots C_n$, can be single or multiple bits wide thereby making the multiplier's output 18 one or more bits wide. As such, the multiple multiplication processes ultimately consumes microprocessor or math coprocessor time regardless of whether the standard prior art single bit FIR filter is implemented in hardware, software, or a combination of both.

Still referring to FIG. 1, if the prior art single bit FIR filter 10 is a 16 tap filter, meaning, for example, the filter handles two 8 bit bytes of data at a time for $\chi_0, \chi_1, \chi_2, \ldots \chi_{15}$, then to provide each output 22, as the data shifts through the input nodes or registers, requires 16 multiplies and 16 addition functions. One can see that processing data through a prior art single bit FIR filter is math intensive even for a relatively small number of bits. For this example of a 16 tap, single bit FIR filter, significant processing time is required to perform all of the 16 multiply functions and the 16 add functions.

Referring now to FIG. 2, an exemplary single bit FIR filter 40 is depicted in block diagram form. The single bit FIR filter 40 has an input 42. A single bit stream of input data enters and is shifted through the input to become input $\chi_0$, then $\chi_0$ and $\chi_1$, then $\chi_0, \chi_1,$ and $\chi_2$ and so on. As the input bits are shifted through nodes or shift registers $\chi_0$-$\chi_7 \ldots \chi_n$, they can be used as a memory address or with a memory address offset 44.

At each shift of the $\chi_0$-$\chi_n$ bits, one or more memory locations are addressed. The memory locations may be found in a RAM, ROM, FLASH or other types of memories. Within each address's memory location 46 is a pre-computed multiplication (by the necessary coefficients) and summation result 48 for each of the possible variations of the first 8 bits of shifted input data. At this point, if the single bit FIR filter is an 8 tap filter the output of $T_O$ 48 would have been performed without a single mathematical calculation because the memory location provides a precalculated correct output $T_O$. Conversely, if an 8 tap ($\chi_0$-$\chi_7$) single bit FIR filter according to FIG. 1 was used the prior art standard FIR filter 10 would have to perform 8 multiplication and 8 addition functions to provide the output 22.

Referring back to FIG. 2, when the single bit FIR filter has more input nodes or taps than can be used to address a single memory address, then a second, third, fourth, and so on address offset 44' is provided to address additional memory locations in order to provide pre-computed combinations of coefficient values for multiplication and summation results 46' for the additional nodes.

The outputs from the memory locations of each of the pre-computed values 48 and each 48' are provided to a summer or accumulator 50 that performs addition functions of two or more of the pre-computed values 48 and each 48'. The output of the accumulator 50 is the output 52 of the exemplary single bit FIR filter 40.

Revisiting FIG. 2 from a slightly different perspective, the data enters the exemplary single bit FIR 50 at the input 42. The entering bits may be either a 1 or a 0. To start with, suppose the first bit is a 0 in $\chi_0$, then the remaining nodes $\chi_1$-$\chi_7$ (the first byte) would also be zero because no data has been shifted to them yet. Thus, the first 8-bit byte is made of all zeros including the first bit in $\chi_0$ of the input. The first byte of all zeros is received by the address offset 44, the address offset 44 may add a predetermined number to the first byte so that a memory location that is greater or equal to the address offset 44 is addressed. The first byte plus the address offset become an address used to pull a pre-computed result from memory. The pre-computed result is equal to the same result a standard prior art FIR filter would have calculated for the same input bits multiplied by the same coefficients and then added together. Each of the pre-computed results retrieved from memory 48, and each 48' are then provided to the accumulator 50 wherein they are added together to provide an output 52 of the FIR filter.

The process is repeated again. The first bit moves to the next data position and the new, second bit moves to the $\chi_0$ position. These two bits $\chi_0$ and $\chi_1$ plus all of the old bits (which would be zero initially) establish addresses via the address offset 44 and 44' to retrieve the pre-computed multiplication/summation values 48, 48' out of the memory or table 46. The retrieved pre-computed multiplication/summation values are provided to the accumulator 50 to thereby produce the second output 52.

This process continues to provide a third and fourth output and all the following outputs each time the input data bits shift to another node in the input 42. The input 42 can be a delay line, a shift register or an array in software or any reasonable derivation thereof. There does not have to be a hardware input register 42 per se, but it could be called an input register or delay line without a specific hardware implementation. In fact, an exemplary single-bit FIR filter in accordance with the present invention could be created and be operational completely in software.

One aspect of an exemplary embodiment is pre-computing the possible results for the multiplication and addition portions of a multiple tap, single bit FIR filter.

More specifically, by taking advantage of the fact that the input is binary and that the data is a single bit wide, pre-computed tables 46, 46' can be easily constructed for each possible input (0 or 1) that is multiplied by each coefficient and added with, for example, similar results from seven other input bits. The result would be that, for each possible combination of 8 input data bits (i.e., a byte of input data bits) there would be a table entry providing a result for the FIR filter's multiplication and addition steps for those 8 bits. Each table entry has an address. The address of each table entry can be related either directly to the 8 input data bits or indirectly by an offset number being added to or, subtracted from, or attached as a prefix or suffix to the 8 bit binary number formed by the input bits.

Referring to FIG. 3, an exemplary method of loading the tables or memory is provided. The tables can be stored in read only memory (ROM) if the coefficients for the FIR filter are to remain constant. Random access memory (RAM) or flash memory may be utilized for constant coefficients as well as in situations when the coefficients require changes, recalculation, upgrades or fine tuning in order to meet desired specifications.

At step 60 of FIG. 3 a routine for loading tables into memory begins. Entry into this routine may occur in the factory or each time an exemplary single bit FIR filter is powered on. An exemplary single bit FIR filter has n nodes wherein a single bit is read at each node. For example, if the single bit FIR filter is 32 bits long, then 32 bits are read from the nodes each time the input data shifts one bit. The nodes may be divided up into 4 sets of 8 nodes. Each set could be considered an 8 bit byte of data. Each bit of each byte is multiplied by a coefficient. The results of each calculation would then be added or accumulated in order to determine the filtered response for the 8 bit byte.

Again, using, for example, a 32 bit input single bit FIR filter, at step 62 each possible bit (0 or 1) is multiplied by the coefficient for the specific node. Each possible 8 bit combination is stepped through (00000000, 00000001, 00000010, 00000011 and so on through 11111111) so that the multiplication and accumulation calculations are performed for the 32 possible bit combinations for the first 8 bit byte. The result of each calculation for each of the 32 possible combinations may be stored in a table or a memory location having the memory address of the 8 bit byte with or without an offset. The same process is done for the second, third and fourth sets of 8 bit bytes. In the end, a table or memory map is created containing the output for each possible eight bit input to the four sets of eight nodes.

At step 64, the result for each possible byte combination is stored in an associated memory location. For example, a byte of the input data bits for the first set ($\chi_0$-$\chi_7$) may be 10101111. The corresponding result of each multiplication and accumulation process for each node's bits 1,0,1,0,1,1, 1,1 may be stored in memory location 10101111. A second byte of data bits for the second set of 8 bit data ($\chi_8$-$\chi_{15}$) will also be 10101111, but the result of the multiplication and accumulation cannot be stored in the same memory location as the first set of 8 bit data byte for the first set ($\chi_0$-$\chi_8$). Thus, an address offset may be added to the second set of 8 bit data ($\chi_8$-$\chi_{15}$) 10101111 so that the result is stored in a memory location that is different than the address 10101111 of the first set of 8 bit data. The results for all the 4 sets of 8 bit bytes of data can be stored in the memory locations in a similar manner.

It is understood that an embodiment of the present invention can use substantially any number of bits as a table location or a memory address. For example, if an exemplary single bit FIR filter is 128 bits long, then the data sets may be one 128 bit address (this may be impractical presently but is possible), two 64 bit sets, four 32 bit sets, eight 16 bit sets, 16 eight bit sets or 32 four bit sets. It is understood also that each set does not necessarily have to be the same number of bits as the other sets of input data bits.

A mathematical technique for determining each pre-calculated result is best understood by reviewing the following example wherein a set or table has a width of four data bits. In other words, for an eight bit word there are two, four bit bytes that are used to address the pre-computed tables 46, 46', each table having a total table width, w, of four. For example:

| | SET = 0 | SET = 1 | SET = m |
|---|---|---|---|
| Input Data Bits$_A$ | $\chi_0 \chi_1 \chi_2 \chi_3$ | $\chi_4 \chi_5 \chi_6 \chi_7$ | $\chi_8 \ldots \chi_n$ |
| Input Data Bits$_B$ | $\chi_{00} \chi_{01} \chi_{02} \chi_{03}$ | $\chi_{10} \chi_{11} \chi_{12} \chi_{13}$ | $\chi_{m1} \cdots \chi_{mw}$ |
| Coefficients$_A$ | $C_0 C_1 C_2 C_3$ | $C_4 C_5 C_6 C_7$ | $C_8 \ldots C_n$ |
| Coefficient$_B$ | $C_{00} C_{01} C_{02} C_{03}$ | $C_{10} C_{11} C_{12} C_{13}$ | $C_{m1} C_{m2} \ldots C_{mw}$ | wherein: w=4(0, 1, 2, 3); the number of sets m=2 (two, four bit sets); the number of bits that can be input, during each data shift, into the FIR filter=n. Input Data Bit$_A$ represent input bits into a prior art single bit FIR filter. Input Data Bits$_B$ represent the same Input Data Bits$_A$, but the subscripts for the data are m, w (set number, bit width number). The Coefficients$_A$ represent the coefficients 0 through n that will each be multiplied by Input Data Bits$_A$ ($\chi_0$-$\chi_n$). Coefficients$_B$ represent the Coefficients, $C_{mw}$, that will be multiplied by Input Data Bits$_B$ ($\chi_{mw}$), respectively. For a prior art, single input FIR filter a summation of each multiplication between $\chi_n$ and $C_n$ is performed and can be mathematically described as:

$$\text{output} = \sum_{n=0}^{n} X_n C_n \quad (1)$$

This equation (1) requires n multipliers and n adds thereby consuming microprocessor or arithmetic processor time.

In an exemplary embodiment wherein the table width, w, is four, a table for Set$_m$=0 would look like:

| Set = 0 | | | SET = m | |
|---|---|---|---|---|
| TABLE INDEX | TABLE VALUE | | TABLE INDEX | TABLE VALUE |
| 0000 | TV$_{01}$ | for set = M | 0000 | TV$_{m,I}$ |
| 0001 | TV$_{02}$ | and W = 4 | 0001 | |
| 0010 | TV$_{03}$ | | 0010 | |
| 0011 | TV$_{04}$ | | 0011 | |
| 0100 | TV$_{05}$ | | 0100 | |
| . | . | | . | |
| . | . | | . | |
| . | . | | . | |
| 1111 | TV$_{0,I}$ | | 1111 | TV$_{m,I}$ | wherein
w = the set or tablewidth;
I = the table index;
TV is the table value,
V = w$^2$ = the number of possible table values; and
I is the table index for set m.

Thus, for set m=1, w=4 and the table index I=0010, then TV$_{M,1}$ is equal to:

$$TV_{12} = 0*C_7 + 1*C_6 + 0*C_5 + 0*C_4 = C_5 = C_{11}$$

Thus, for each TV in a set m having a width w $$TV_{m,I} = \sum_{w=1}^{w} \text{Index Value bit } (w) * C_{m,w}$$

The resulting single bit FIR filter output is thus equal to:

$$\text{output} = \sum_{m=0}^{m} TV_{m,I}$$

In other words, an exemplary FIR filter's output will be the summation of each table value, TV, associated with the set of bits, m, that have shifted into the FIR filter's inputs. If the exemplary single bit FIR filter is 16 bits long and the input of the filter is separated into four sets, m, of four bits, w, then there will only be 4 look-ups into the tables and four accumulation functions to produce the output. This exemplary processes takes significantly less time than prior art single bit FIR filters performing, 16 multiply and 16 accumulation steps, because less processing time is required.

In an embodiment with eight 16 bit sets, there will be eight memory lookups and eight accumulation steps to provide each output of an exemplary single bit FIR having a 128 input bit feed. The pre-calculation of the 16 coefficient multiplications and 16 accumulations for each set (either stored in ROM or performed at startup and stored in RAM or other program memory) greatly decreases the arithmetic load on a microprocessor or co-processor in the system because all the multiplication steps have been completed and a majority of the addition steps have also been completed.

As the input set size gets larger the amount of storage or memory required for the pre-calculated results increases. For each 16 bit input set about 64K of memory is required. Thus, a 128 bit input for the single bit FIR with eight 16 bit sets would require about 512K of memory.

It is understood by those of ordinary skill in the art that there may be some memory storage shortcuts or "tricks" that can be utilized with embodiments of the present invention that do not deviate from the spirit of the invention. For example, when there is a repetitious organization of coefficients or where a coefficient zero are not used in a multiplication calculation to create a stored value (because the multiplication value will equal 0). Other creative techniques for decreasing the actual amount of memory required to store the pre-calculated data are also available and would be known to one of ordinary skill in the art. For example, when different input bit combinations to the FIR filter mathematically equal the same stored values such that the same memory address is used for both data input combinations.

Exemplary embodiments of single bit FIR filters can be executed strictly in software running on a computer. The software can be stored in the computer such that a microprocessor and related electronic devices perform the steps prescribed by the software. FIG. 4 depicts a flow diagram for an exemplary embodiment as it may function in software, firmware or hardware or a combination thereof. At step 70 the coefficients are multiplied with the possible sets of bits in the input and the answers are accumulated and stored in proper memory locations as discussed with respect to FIG. 3. The memory locations coincide with the pre-computed memory portions 46, 46' in FIG. 2. The pre-calculated combinations of coefficients 46, 46' can be calculated in step 70 during manufacturing of a device or prior to each operation of an exemplary single bit FIR filter.

At step 72, a first bit from the serial bit stream or other data source is shifted into the first input position node, shift register, variable register or temporary register of Set 0. The input nodes of set 0 (which at this point will be mostly zeros because only one bit has been shifted in) are used either with or without the address offset function 44 to address a memory location in the pre-computed combinations of coefficients 46 memory. The memory location provides the precalculated result of a single bit FIR filter having the same input profile as the bits in set 0.

At step 74, the contents of the set 0 addressed memory location is accumulated with the contents of the memory locations associated with the input bits found in sets 1 through m. (In this case so far, they are all zero bits). In step 76, the accumulation result is provided as the first output of the exemplary single bit FIR filter.

At step 78, the next bit is shifted into the input such that the first data bit and all other bits are shifted one or more positions. At step 72, the reading of the input bits over the length of the filter is performed again and pre-computed values for each data set are retrieved. The loop of steps 72, 74, 76 and 78 are repeated as long as data bits are flowing into the FIR filter software program, hardware or combination thereof.

In another exemplary embodiment, depicted in FIG. 2, instead of a single bit FIR filter, a two bit FIR filter is shown using input 42'. Here a two bit wide stream of data is shifted into the input 42' as $\chi_{01}, \chi_{02}, \chi_{11}, \chi_{12}, \chi_{31}, \chi_{32} \ldots \chi_{n1}, \chi_{n2} \ldots \chi_{nd}$ (Wherein n = the bit number and d = the bit width of the input.)

In a similar manner as in the other exemplary embodiments, a pre-calculated table is made for the coefficient-multiplication and accumulation of each of the 2 bit width data. The results are stored in memory locations having addresses related to the input data bits.

When the 2 bit FIR filter is operational, the two bit data entries shift down the input 42' and the appropriate multiplication and accumulation results are fetched from memory. The fetched results are accumulated 50 to produce an output 52 for each shift movement of data. It is understood that embodiments having more than a two bit wide input stream are possible so long as enough memory is available for the pre-calculated multiplication and accumulation functions.

The previous description is of a preferred embodiment for implementing the invention, and the scope of the invention should not necessarily be limited by this description. The scope of the present invention is instead defined by the following claims.

What is claimed is:

1. A single bit FIR filter comprising:
    a shift register comprising an input adapted to receive a plurality of serial input bits, said input bits being a single bit wide; said shift register comprising a predetermined number of nodes; said input nodes separated into at least two sets of nodes; wherein said plurality of input bits to shift down a length of said shift register;
    a storage device having a plurality of memory locations, each said memory location having an address;
    means for using bits in a first set of nodes to address one of said memory locations and receive first content;
    means for using bits in a second set of nodes, after applying an address offset to the bits which is not applied against the bits in the first set of nodes, to address one of said memory locations and receive second content; and
    an accumulator providing at an output an accumulation of the first and second contents of the memory locations that were addressed.

2. A single bit FIR filter for comprising:
    a register having an input for receiving a stream of serial input bits, said register comprising a plurality of node sets, each said node set outputting a set of input bits from said serial stream of input bits;
    a memory comprising a plurality of memory locations each having an address and storing a value;
    first circuitry for addressing the memory locations addressed by bits of a first one of said node sets to retrieve a first value and second circuitry for addressing the memory locations addressed by bits of a second one of said node sets, following application of an address offset to those bits of the second node set which has not been applied against the bits of the first node set, to retrieve a second value;
    an accumulator adapted to receive the first and second values of said addressed memory locations; said accumulator adding said first and second values and producing a result; said result being substantially an output of said single bit FIR filter.

3. The single bit FIR filter of claim 2, wherein each input node set comprises a same number of bits.

4. The single bit FIR filter of claim 2, wherein said node sets comprise shift registers.

5. A method for providing a single bit FIR filter comprising:
    receiving serial data into a register, said register being divided into first and second sets of data locations;
    using data from said first set of data locations to address first memory locations;
    applying an address offset to data from said second set of data locations to produce offset data, wherein the address offset is not applied against the data of the first set of data locations;
    using the offset data to address second memory locations;
    reading the contents of said addressed first and second memory locations;
    accumulating the contents of said addressed first and second memory locations; and
    providing a single bit FIR filter output comprising the accumulated contents.

6. The method of claim 5 further comprising, after said using step, shifting said data in the register at least one input data position.

7. The method of claim 5 further comprising shifting said data at least one data location in the register and after said step of providing repeating said method starting at said step of receiving.

8. The method of claim 5 further comprising loading said memory locations with values prior to the step of receiving.

9. The method of claim 5, wherein each set of data locations comprises the same number of bits.

10. A method of providing a single bit FIR filter comprising:
    inputting a serial stream of data into register having a plurality of data locations;
    dividing said plurality of data locations into first and second sets of data locations;
    addressing a memory location of a memory with data from the first set of data locations;

applying an address offset to data from said second set of data locations to produce offset data, wherein the address offset is not applied against the data of the first set of data locations;

addressing a memory location of the memory with the offset data;

reading the contents of each addressed memory location;

accumulating the read contents from the addressed memory locations; and providing the accumulated contents as an FIR output.

* * * * *

UNITED STATES PATENT AND TRADEMARK OFFICE
CERTIFICATE OF CORRECTION

PATENT NO. : 7,386,581 B2 Page 1 of 1
APPLICATION NO. : 10/750019
DATED : June 10, 2008
INVENTOR(S) : Carson H. Zirkle It is certified that error appears in the above-identified patent and that said Letters Patent is hereby corrected as shown below:

At column 7, claim 1, line 57, remove the word [input].

At column 8, claim 3, line 27, remove the word [input].

Signed and Sealed this
Second Day of August, 2011

David J. Kappos
*Director of the United States Patent and Trademark Office*